United States Patent [19]

Roos et al.

[11] Patent Number: 5,455,964
[45] Date of Patent: Oct. 3, 1995

[54] STABILIZATION OF FREQUENCY AND POWER IN AN AIRBORNE COMMUNICATION SYSTEM

[75] Inventors: David A. Roos, Boyds; John R. Clewer, Ijamsville; Seok-Ho Kim, North Potomac; James E. Malcolm, Gaithersburg; Andrew W. Brandt, Frederick; Allan A. D'Souza, Germantown; Adrian J. Morris, Gaithersburg; Matthew M. Mohebbi, North Potomac, all of Md.

[73] Assignee: Claircom Communications Group, Inc., Seattle, Wash.

[21] Appl. No.: 42,426

[22] Filed: Mar. 26, 1993

[51] Int. Cl.$^6$ ............... H04Q 7/38; H04B 1/10; H04B 7/26; G01S 3/52
[52] U.S. Cl. ............ 455/34.2; 455/54.2; 455/63; 455/67.4; 455/69; 455/71; 342/418; 379/63
[58] Field of Search ............... 455/12.1–13.2, 455/33.1, 33.4, 34.1, 34.2, 54.1, 54.2, 56.1, 52.1, 52.3, 62, 63, 67.1, 67.5, 67.6, 69–71; 342/418; 379/59, 63

[56] References Cited

U.S. PATENT DOCUMENTS

| | | | |
|---|---|---|---|
| 4,419,766 | 12/1983 | Goeken et al. | 455/62 |
| 4,811,421 | 3/1989 | Havel et al. | 455/69 |
| 4,984,290 | 1/1991 | Levine et al. | 455/33.2 |
| 5,056,109 | 10/1991 | Gilhousen et al. | 455/33.1 |
| 5,123,112 | 6/1992 | Choate | 455/34.1 |
| 5,179,559 | 1/1993 | Crisler et al. | 455/33.1 |
| 5,276,908 | 1/1994 | Koohgoli et al. | 455/54.1 |

Primary Examiner—Chi H. Pham
Assistant Examiner—Mark D. Wisler
Attorney, Agent, or Firm—Knobbe, Martens, Olson & Bear

[57] ABSTRACT

The frequency and power of transmissions in a mobile communication system, such as an air-to-ground telephony system, are stabilized without a priori knowledge of the system gain factors or frequency references. The ground station monitors the available channels and modifies a vacant channel broadcast message to provide information that the channel is available. In this way, the air terminals have knowledge of all available channels. The ground station transmits a pilot signal. Upon request by a user for a dial tone at the air terminal, the air terminal selects a vacant channel and scans for the pilot signal. The air terminal estimates a distance to the ground station and sets a power level of a seizing transmission based on the estimated distance. The air terminal also estimates a Doppler frequency shift of the selected channel due to the relative movement of the air terminal with respect to the ground station and sets a frequency of the seizing transmission based on the estimated Doppler frequency shift. The air terminal then transmits a channel seizing signal at a reduced bandwidth less than a full normal bandwidth to the ground station at the set level and frequency. The ground station measures the level and frequency of the seizing signal and transmits to the air terminal information acknowledging the seizure of the selected channel and reporting the level and frequency of the seizing signal. The air terminal corrects the transmitted level and frequency and then switches the transmission bandwidth to the full normal bandwidth at the corrected level.

34 Claims, 7 Drawing Sheets

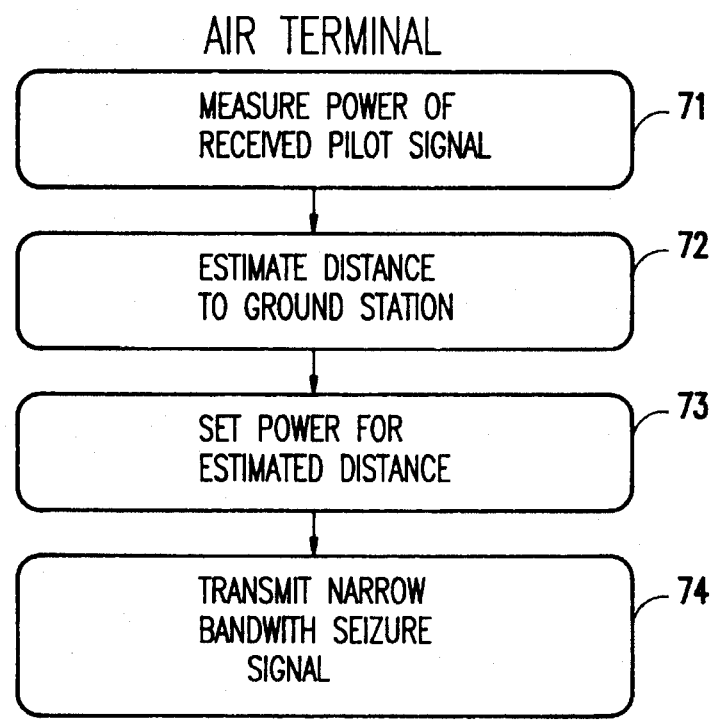
FIG. 7A
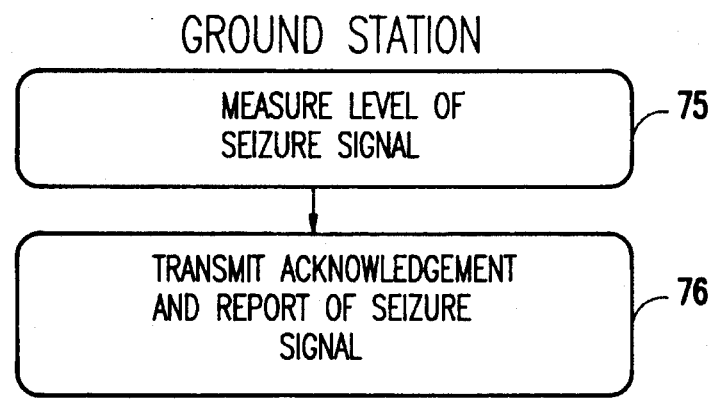
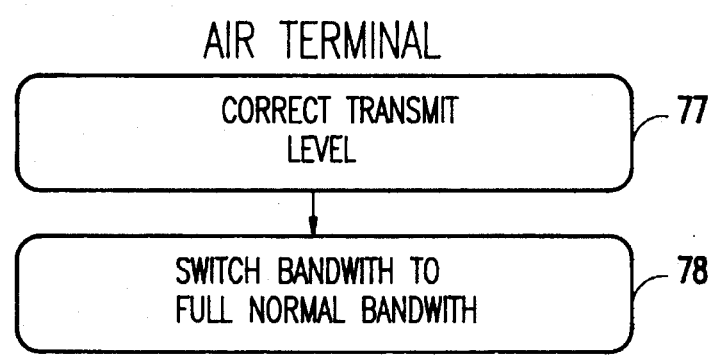
FIG. 7B

STABILIZATION OF FREQUENCY AND POWER IN AN AIRBORNE COMMUNICATION SYSTEM

BACKGROUND OF THE INVENTION

1. Field of the Invention

The present invention generally relates to mobile communication systems, such as air-to-ground communication systems, and more particularly, to a system which compensates for signal level changes and Doppler frequency shifts in the communication system without requiring precise a priori knowledge of the signal gains of the fixed or mobile components or frequency references. The invention enables mobile terminals to employ significantly lower cost frequency references while achieving performance comparable to implementations using much more precise references. In addition, the invention allows for dynamic compensation of other time, temperature, and unit-to-unit variations in gain and frequency which inevitably introduce errors into systems based on a priori measurements and knowledge of the gain and frequency profiles of the system components.

2. Description of the Prior Art

In an airborne communication system, the distance and rate of change of distance from the aircraft air terminal to a ground station are constantly varying. This introduces signal level changes and Doppler frequency shifts which must be compensated to minimize the interference potential to other services. In the prior art, high precision reference oscillators and a priori knowledge of the system gain factors are needed to ensure that the measurements made in the aircraft are correct. This approach is expensive to implement. What is needed is a less complex, and hence less expensive, alternative to the current compensation techniques used in the prior art.

SUMMARY OF THE INVENTION

It is therefore an object of the present invention to provide an aircraft communication system that is capable of calibrating itself against each ground station reference both in terms of signal level and transmission frequency, even in the face of many dBs of variation in the receive/transmit chain or many ppm of variation in the reference oscillator stability.

According to the invention, there is provided a closed-loop method for calibrating out the effects of long-term system variations and dead reckoning for signal level and Doppler offset compensation. The invention is implemented on an airborne, or mobile, communication system having a radio frequency (RF) transmitter and receiver, processing logic to measure the perceived level and frequency of the received (i.e., ground-to-air) signal, and control software to control the transmitted level and frequency based on the perceived receive level and frequency and based on the information coming from the ground station(s). The ground-based communication systems have an RF receiver and transmitter tuned to communicate with the airborne system(s), frequency and signal level references used for self-calibration, processing logic to measure the signal level and frequency of the air-to-ground signal, relative to the ground-based references, and communications software to report the measured level and frequency to the airborne equipment.

An important feature of the invention is that when the initial contact is made with a ground station, even before it has been calibrated, the system does not exceed FCC-imposed channel allocation for the transmission. This is done by reducing the bit rate (hence, narrowing the spectrum) by an amount sufficient to keep the uncalibrated signal within the required bandwidth. Another important feature of the invention is the use of self-calibrating ground station(s). No precise knowledge is needed of the ground station receive gain. A reference signal is introduced before any active component so that variations due to time, temperature, and unit-to-unit affect both the reference signal and the received air-to-ground signals. Thus, the accuracy is determined by the accuracy of the reference, not the characteristics of all the RF components in the receive chain.

The invention is disclosed in the environment of an airplane to ground telephony system, but the principles described are also applicable for a low earth orbiting satellite system in which the "mobile" stations (the users) communicate with "fixed" sites (earth stations) via satellites which are moving. In this system, the Doppler shift and signal level variations introduced by the movement of the mobile stations relative to the fixed sites may be insignificant compared to that introduced by the movement of the satellite.

BRIEF DESCRIPTION OF THE DRAWINGS

The foregoing and other objects, aspects and advantages will be better understood from the following detailed description of a preferred embodiment of the invention with reference to the drawings, in which:

FIGS. 7A and 7B are flow diagrams showing the principle processes of the gain control implemented by the invention.

DETAILED DESCRIPTION OF A PREFERRED EMBODIMENT OF THE INVENTION

Figure 1:
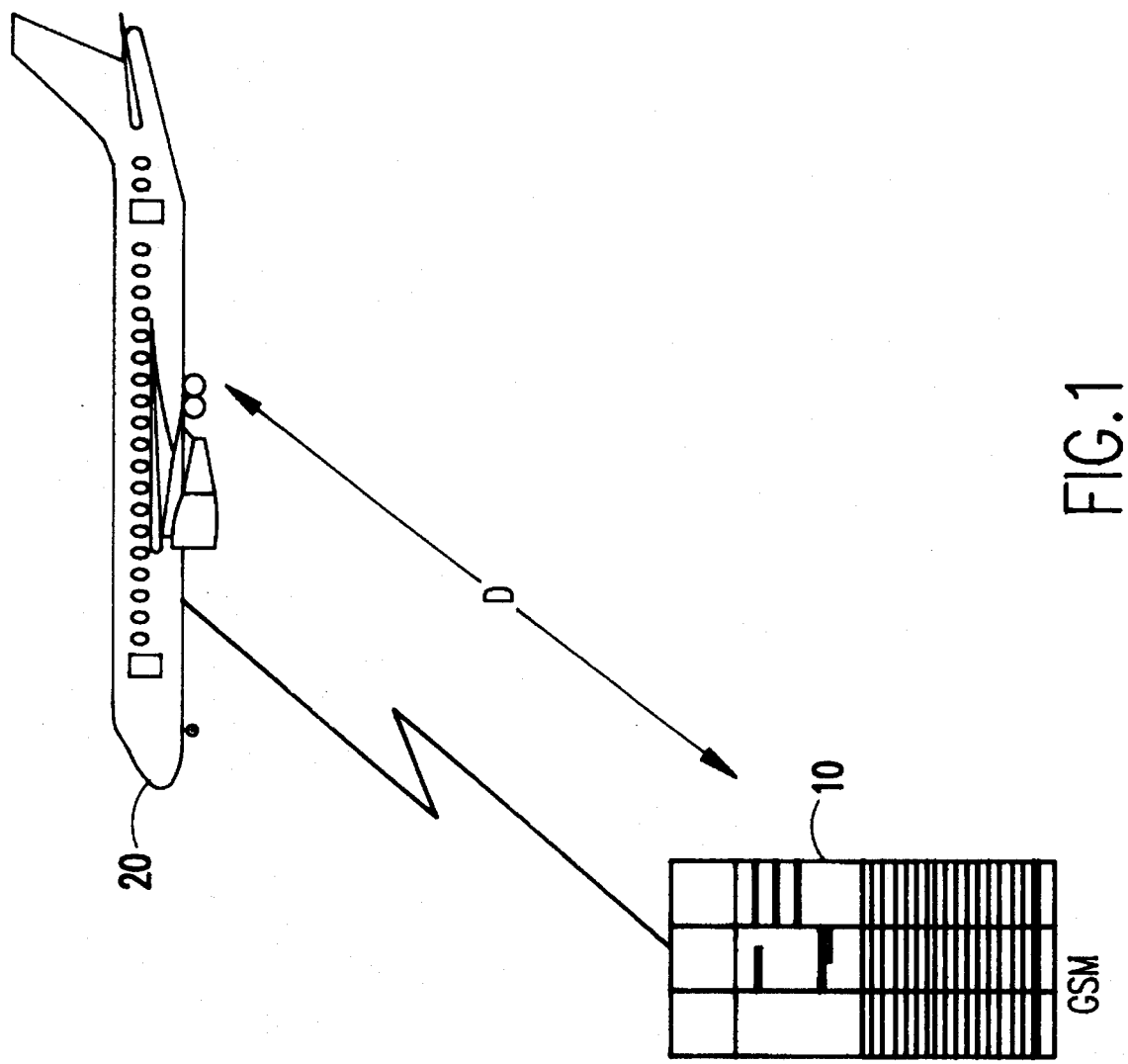
FIG. 1 is a block diagram showing the relative location of an air terminal installed on an aircraft with respect to a ground station.

Referring now to the drawings, and more particularly to FIG. 1, there is shown a ground station 10 and an aircraft 20. The aircraft 10, at any given point in time, is separated by a distance D from the ground station 20, and this distance, among other variables, has an effect on the relative loss of a transmission between an air terminal on the aircraft and the ground station. Moreover, the distance D is constantly changing with time as the aircraft 10 passes over or proximate to the ground station. As D changes, the signal path loss also changes. The rate of change, $$\Delta D/\Delta t, \text{ introduces a Doppler frequency shift in the received signal.}$$

Both the variation in loss and the Doppler shift must be compensated.

Figure 2:
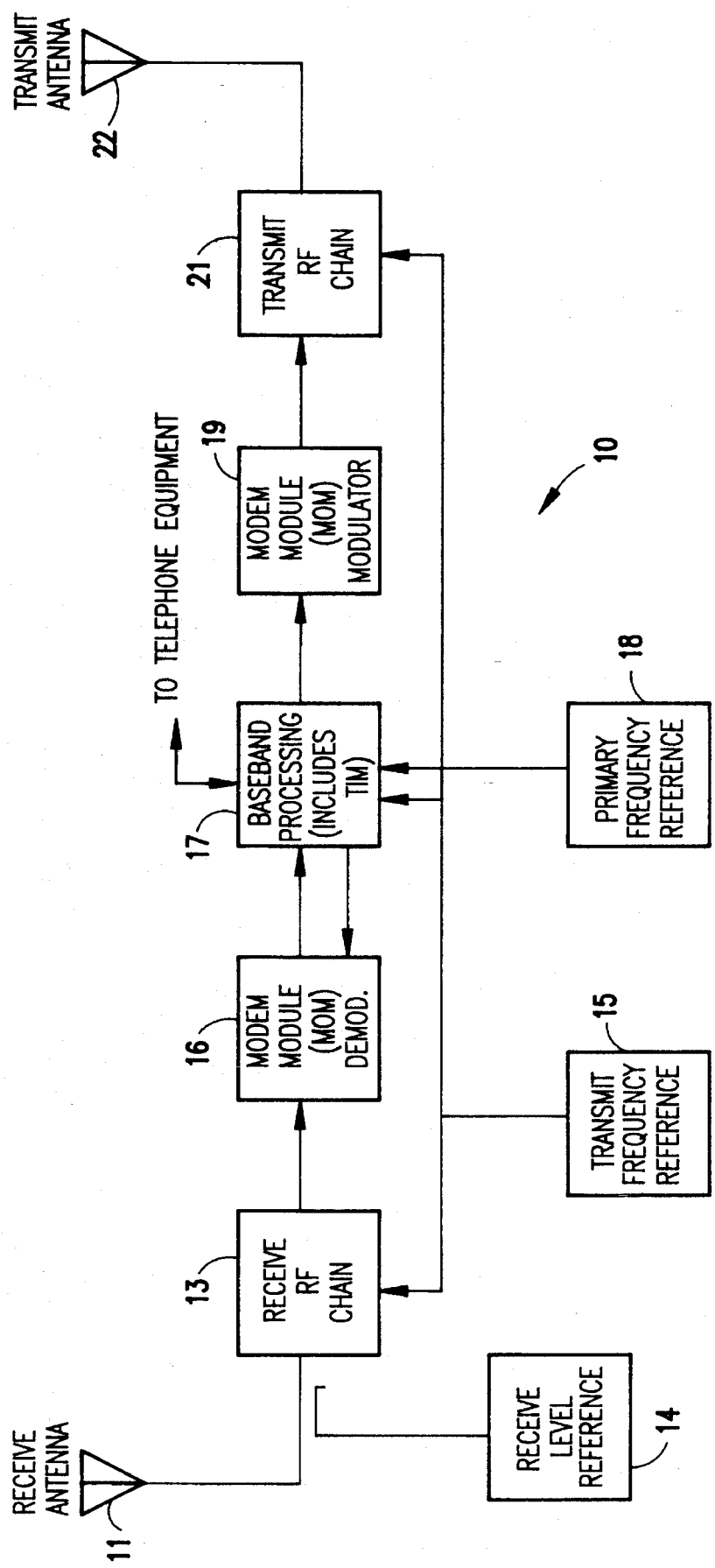
FIG. 2 is a high level block diagram of the major components of the ground station as used to implement the invention.

FIG. 2 shows the major components of the ground station 10. The receive antenna 11 is connected through a signal combiner 12 to the receiver radio frequency (RF) chain 13. The signal combiner 12 also feeds a signal from a test tone reference module 14 to the RF chain 13. The RF chain 13 is supplied with a signal from transmit frequency reference 15 and provides an output to the modem module (MOM) demodulator 16. The output of the MOM demodulator 16 is a baseband signal which is supplied to the baseband processing unit 17. This unit communicates with the public switched telephone network (PSTN) and receives inputs from both the transmit frequency reference 15 and a primary frequency reference 18. The baseband processing unit also provides an output to the MOM modulator 19 which supplies the modulating signal to the transmit RF chain 21. The transmit RF chain 21 also receives a signal from the transmit frequency reference 15 and supplies modulated signals for each channel and a pilot signal to transmit antenna 22.

Figure 3:
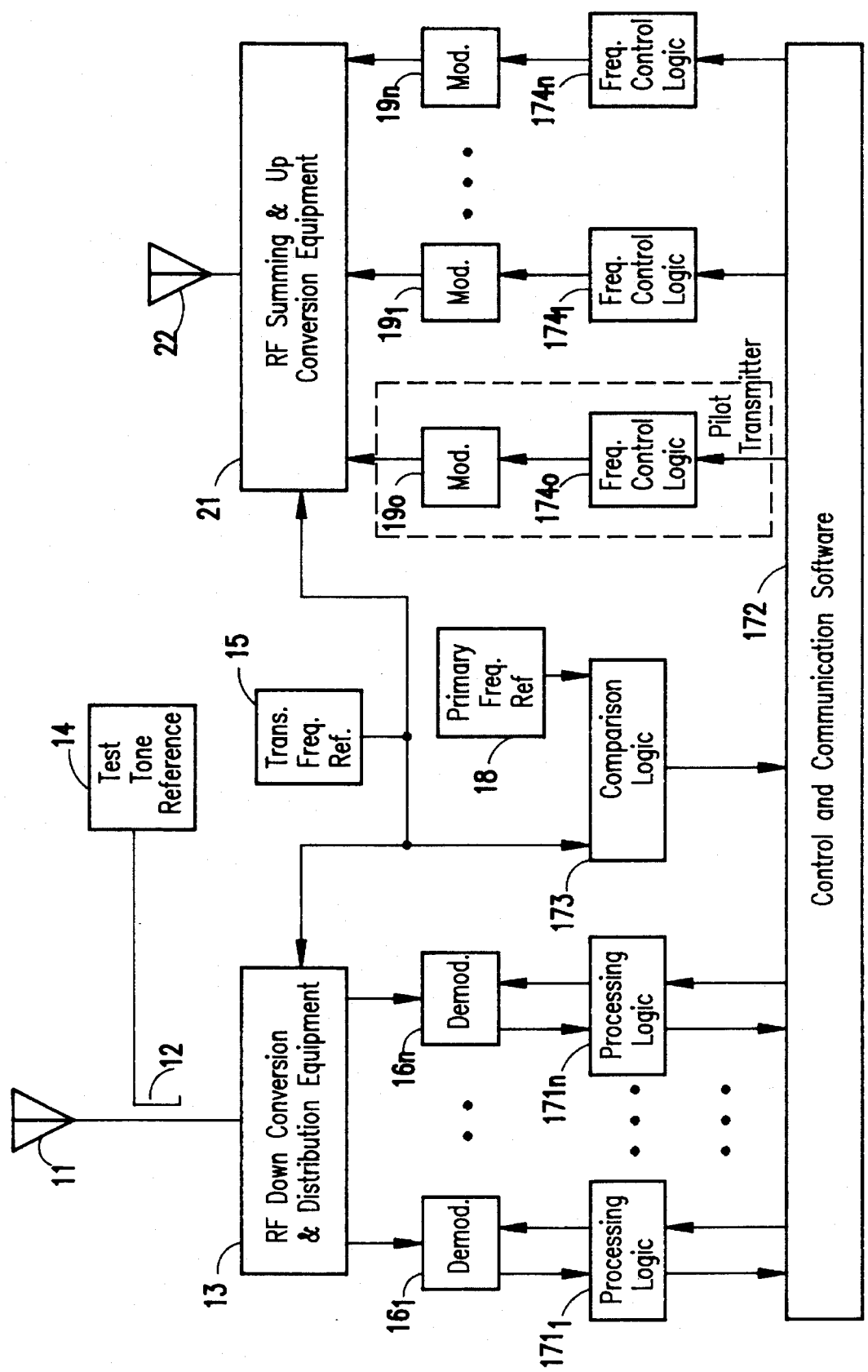
FIG. 3 is a more detailed block diagram of the ground station.

FIG. 3 shows in more detail the ground station, wherein like reference numerals designate the same or equivalent components. One or more receive antennas 11 are used to receive transmissions from the aircraft. One or more sets of RF down conversion and distribution equipments 13 are used to convert received signals to more convenient intermediate frequencies (IFs) for use by the demodulators $16_1$ to $16_n$. The demodulators $16_1$ to $16_n$ are used to select a particular receive frequency and extract baseband signals therefrom. One or more sets of processing logic $171_1$ to $171_n$ associated with the demodulators perform the following functions:

i. tuning, under control of software, the nominal demodulated receive frequency;

ii. detecting the presence of a useable signal;

iii. measuring the perceived signal level of the received signal; and iv. measuring the perceived frequency offset of the received signal.

The processing logic is controlled by control and communication software 172 and a suitable hardware platform which executes the software. This software performs the computations and coordinations described in more detail hereinafter. One or more test tone references (or generators) 14 produce a signal of prescribed frequency and level in an unused section of the receive band. One or more transmit frequency references 15 produce a signal of prescribed frequency with suitably low phase noise for performing the frequency translations of the RF down conversion and the up conversion. A single primary frequency reference 18 serves as the absolute reference frequency for the ground station. One or more comparison logic 173 compares the frequency of the primary frequency reference 18 with the transmit frequency references. Two or more frequency control logic $174_0$ and $174_1$ to $174_n$ are controlled by the control software 172 to set the frequency of transmission of the modulators $19_0$ and $19_1$ to $19_n$. One frequency control logic $174_0$ is designated for use by the pilot transmitter chain and the others are for one or more traffic channels, which are used as required by the air terminals requesting service from the ground station. Two or more modulators $19_0$ and $19_1$ to $19_n$ modulate carriers at prescribed frequencies with baseband data. As for the frequency control logic $174_0$, one modulator $19_0$ is for the pilot channel and the others are for the traffic channels. One or more sets of RF summing and up conversion equipments 21 frequency translate the modulated signals from the modulators to the desired transmit frequencies. Finally, one or more transmit antennas 22 transmit the signals from the ground station to one or more air terminals within the range of the ground station.

In the preferred embodiment, only one active transmission frequency reference is used for all channels (there is another redundant transmission frequency reference, as well). There could be any number of transmission frequency references for any number of channels, and there could be a single comparison circuit for each transmission frequency reference.

Figure 4:
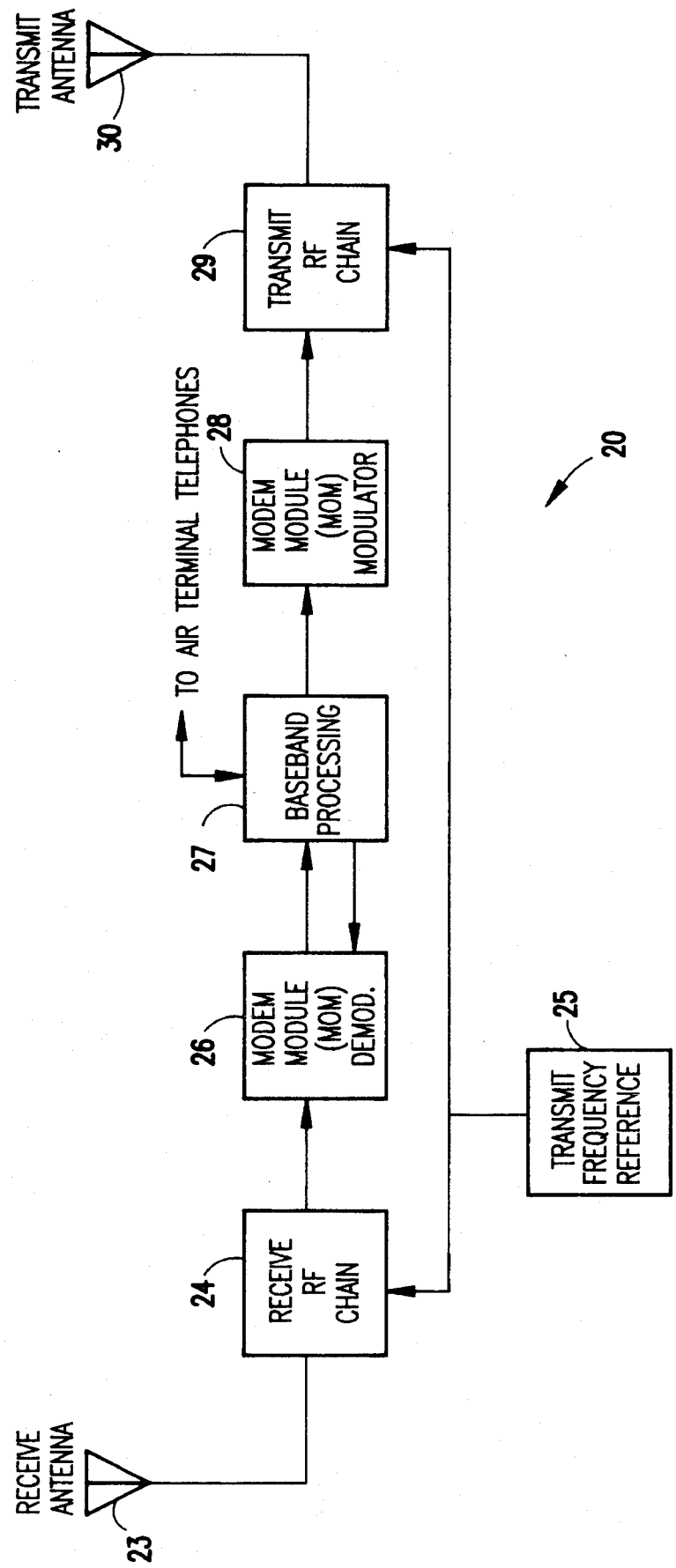
FIG. 4 is a high level block diagram of the major components of the air terminal as used to implement the invention.

FIG. 4 shows the major components of the air terminal 20. The receive antenna 23 is connected to the receiver radio frequency (RF) chain 24. The RF chain 24 is supplied with a signal from transmit frequency reference 25 and provides an output to the modem module (MOM) demodulator 26. The output of the MOM demodulator 26 is a baseband signal which is supplied to the baseband processing unit 27. This unit communicates with the air terminal telephones. The baseband processing unit also provides an output to the MOM modulator 28 which supplies the modulating signal to the transmit RF chain 29. The transmit RF chain 29 also receives a signal from the transmit frequency reference 25 and supplies a modulated signal to transmit antenna 30.

Figure 5:
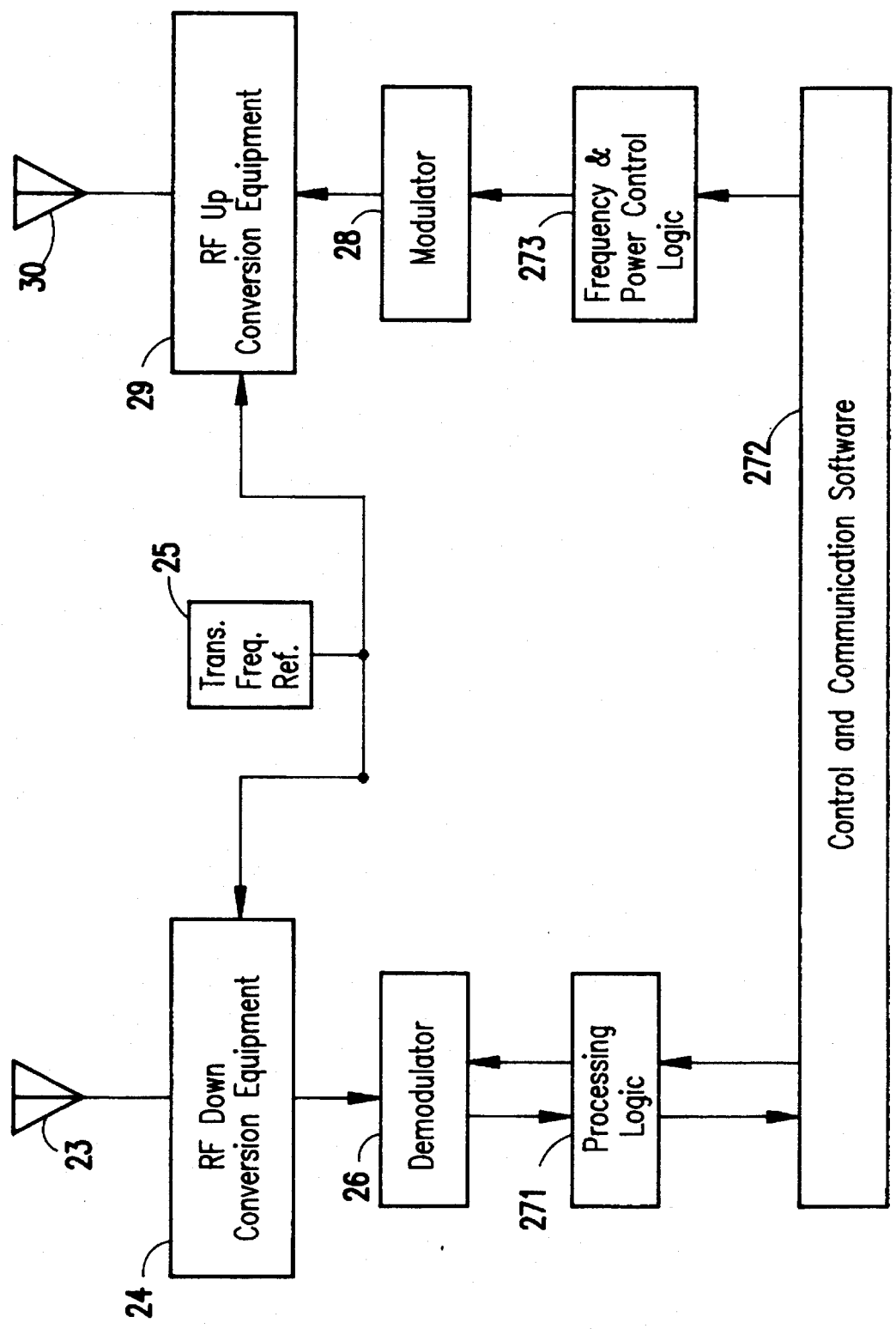
FIG. 5 is a more detailed block diagram of the air terminal.

FIG. 5 shows in more detail the air terminal, wherein like reference numerals designate the same or equivalent components. One or more receive antennas 23 receive ground station transmissions. One or more RF down conversion equipment 24 translate the ground station signals to a convenient intermediate frequency (IF) for the demodulators 26. One or more processing logic 271 receive demodulated signals from the demodualtors 26. The processing logic 271 has the same capabilities as the processing logic 171 in the ground station. Control and communication software 272 running on a suitable hardware platform performs the computations and coordinations described hereinbelow. One or more transmit frequency references 25 provide the reference frequency for the down conversion and up conversion processes. One or more frequency and power control logic 273 allow the control software 272 to set the frequency and power of the associated modulator 28. The modulators 28 modulate the carrier at the frequency and power set by the frequency and power control logic 273. One or more up conversion equipment 29 translate the signals generated by the modulators to the desired RF frequency, and one or more transmit antennas 30 transmit the signals from the air terminal to the ground station. Note that the receive and transmit antennas may be merged into one with a diplexer to combine the signals onto a single antenna without loss of generality.

Link Seizure

The ground station 10 monitors the available channels. When a modem on the ground station discovers a channel which is vacant, the ground station controller software 172, shown in FIG. 3, modifies the vacant channel broadcast message to include that channel as available. A channel available is the logical AND of a channel being vacant and a ground station modem tuned to that channel. Every air terminal listening to that ground station then knows of every available channel.

Unused voice channels in the air terminal are tuned to the pilot frequency of the preferred ground station. They then have the most recent channel availability information. When an airline telephone user requests a dial tone, the aircraft air terminal controller software running on the control software 272 shown in FIG. 5 randomly selects a voice channel from all the available channels. The air terminal control software 272 also measures the signal loss and frequency offset of the pilot signal. The air terminal control software 272 tunes to the correct frequencies and starts the channel seizing modulation process. The seizing modulation occupies one quarter of the normal channel bandwidth. Any frequency or power errors therefore do not impact on adjacent channels.

The air terminal 20 also sets the power level of the modulator output according to the formula in the following equation:

$$P_{TX(seizure)} = P_{TX(nominal)} - P_{RX(actual)} + P_{RX(nominal)} \quad (1)$$

All terms in the above equation are in dB or dBm. "Nominal" values of transmit and receive power are those corresponding to maximum output power and minimum input power, respectively.

The channel seizing modulation lasts approximately 1000 milliseconds to enable all users to reconcile all collisions. During that time, the air terminal control software 272 is notified in the return voice channel that its transmission was accepted by the ground station. In the absence of the return message in the voice channel specifically addressed to the air terminal, the air terminal controller software assumes a collision and tries again on another randomly selected available channel, with a random backoff time.

In its acknowledgement in the return voice channel, the ground station tells the air terminal software 272 the ground station's measurement of the power and frequency offset of the air terminal's seizure transmission. This gives the air terminal enough information to calibrate its transmission frequency reference and to calibrate the losses or gains in its receive and transmit chains. The air terminal then can establish full-bandwidth communication with the ground station with its signal nearly perfectly level. As Doppler shift and levels change, the air terminal measures the ground-to-air Doppler shift and level and corrects its air-to-ground transmission accordingly to maintain optimum (i.e., near zero) frequency offset and optimum (i.e., nominal) levels as measured at the ground station. The ground station also measures these parameters and, as a double-check, sends incremental corrections back to the air terminal in the event that one parameter or the other is not correct.

In the next sections, the details of frequency and power calibration are described in terms of values measured by the demodulators' processing logic in the air terminals and the ground stations, and the comparison logic in the ground stations, as well as actual (physical) frequencies and levels. The formulas and equations relate to the preferred embodiment, but those skilled in the art will recognize that the details can be modified to suit other embodiments without loss of generality.

Definitions $F_{ref}$: The actual frequency of the Transmission Frequency Reference oscillator. If the reference oscillator were perfect, $F_{ref}$ would be exactly 10 MHz in the preferred embodiment. $F_{ref}$ applies to the Transmission Frequency Reference oscillator in the air terminal, as well as the transmission frequency references in the ground station, not the Primary Frequency Reference. The estimates of $F_{ref}$ in the equations below are denoted $\hat{F}_{ref}$.

$F_{primary}$: The actual frequency of the Primary Frequency Reference. This is a calibration factor applied periodically to the Primary Frequency Reference to counter long-term drift in the Reference.

$F_{corrected}$: The frequency number (in Hz) that the software outputs so that the actual frequency of the operation equals $F_{desired}$.

$F_{offset}$: The difference between $F_{corrected}$ and the receive signal's center frequency at the intermediate frequency (IF). The air terminal demodulator and processing logic measure this parameter. It is positive if the actual IF receive frequency is greater than expected.

$F_{TXssff}$: The transmission frequency of ss (either Air Terminal (AT) or Ground Station (GS)) at ff (either RF or IF). $F_{TXGSRF}$ is exactly the assigned ground stations' transmit frequencies. $F_{TXATRF}$ is the frequency at which the Air Terminal (AT) must transmit to ensure that the ground station receives the signal within the desired frequency band.

$F_{RXssff}$: The reception frequency at RF. It may include Doppler shift.

The ss and ff nomenclatures have the same meanings as above.

$F_{Doppler}$: The Doppler shift experienced by signals in the ground-to-air direction.

1.05294: The ratio of the air-ground frequency band to the ground-air frequency band. Doppler shift is proportional to operating frequency, so for a given aircraft flying at a given speed relative to a ground station, the air-to-ground Doppler shift is 1.05294 times the ground-to-air Doppler shift. 1.05294 is an average value within 0.02%, worst case. Alternatively, the ratio of the particular frequencies involved could be used, but generally this is not necessary.

87.36: The exact multiplier used in the Transmitter Frequency Reference Module to generate the up or down conversion frequencies in the ground station.

87.14: The exact multiplier used in the Transmitter Frequency Reference Module to generate the up or down conversion frequencies used in the air terminal.

General Formulae

Equation (2) is the formula for correcting $F_{desired}$ to $F_{corrected}$:

$$F_{corrected} = F_{desired} \times \frac{10^7}{\hat{F}_{ref}} \quad (2)$$

Equation (3) is the formula for converting the corrected ground station intermediate frequency (IF) transmission frequency to the actual transmission frequency:

$$\begin{aligned} F_{TXGSRF} &= 87.36 \hat{F}_{ref} - F_{TXGSIF} \\ &= 87.36 \hat{F}_{ref} - \frac{F_{corrected} \times \hat{F}_{ref}}{10^7} \\ &= \hat{F}_{ref} \times \left( 87.36 - \frac{F_{corrected}}{10^7} \right) \end{aligned} \quad (3)$$

Equation (4) is the formula for converting the corrected ground station IF reception frequency to the actual radio frequency (RF) reception frequency:

$$\begin{aligned} F_{RXGSRF} &= 87.36 \hat{F}_{ref} + F_{RXGSIF} \\ &= 87.36 \hat{F}_{ref} + \frac{F_{corrected} \times \hat{F}_{ref}}{10^7} \\ &= \hat{F}_{ref} \times \left( 87.36 + \frac{F_{corrected}}{10^7} \right) \end{aligned} \quad (4)$$

Equation (5) is the formula for converting the corrected air terminal IF transmission frequency to the actual transmission frequency:

$$F_{TXATRF} = 87.14\hat{F}_{ref} + F_{TXATIF} \quad (5)$$

$$= 87.14\hat{F}_{ref} + \frac{F_{corrected} \times \hat{F}_{ref}}{10^7}$$

$$= \hat{F}_{ref} \times \left( 87.14 + \frac{F_{corrected}}{10^7} \right)$$

Equation (6) is the formula for converting the corrected air terminal IF reception frequency to the actual RF reception frequency:

$$F_{RXATRF} = 87.14\hat{F}_{ref} + F_{RXATIF} \quad (6)$$

$$= 87.14\hat{F}_{ref} + \frac{F_{corrected} \times \hat{F}_{ref}}{10^7}$$

$$= \hat{F}_{ref} \times \left( 87.14 + \frac{F_{corrected}}{10^7} \right)$$

From the above equations and knowledge of the spectrum allocation, we see that the nominal transmit IF center frequency is 23.6±1 MHz. The nominal receive IF center frequency is 21.4±1 MHz. These center frequencies are valid for air or ground.

Frequency Calibration

Figure 6A:
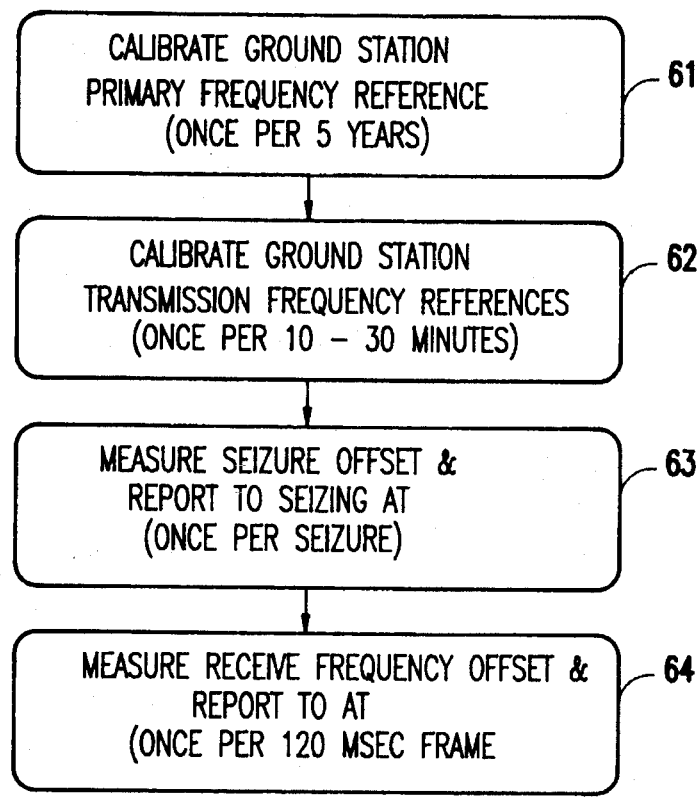
FIGS. 6A and 6B are flow diagrams showing the principle processes of the frequency control implemented by the invention.
Figure 6B:
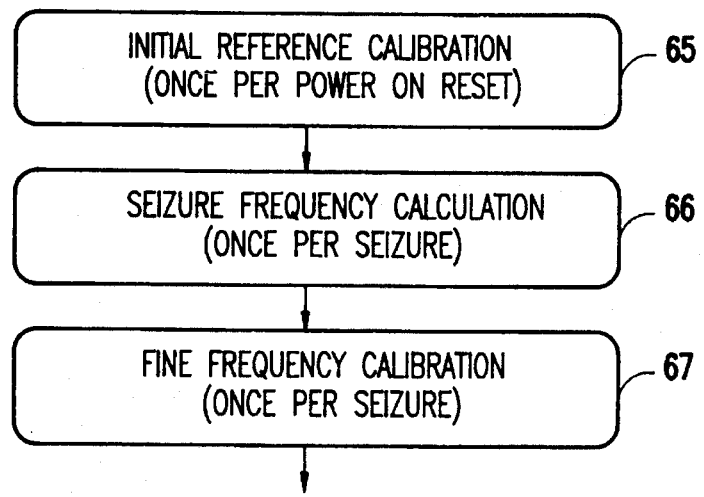

FIGS. 6A and 6B are flow diagrams summarizing the frequency calibration procedure according to the invention. At the ground station 20, the primary frequency reference is calibrated periodically on a long term basis, say, once every five years, as indicated in function block 61 of FIG. 6A. In the short term, the ground station calibrates transmission frequency references once every ten to thirty minutes, as indicated in function block 62. When an air terminal seizes an available channel, the ground station measures the seizure offset and reports to the seizing air terminal, as indicated in function block 63. In addition, the ground station, in function block 64, measures the receive frequency offset and reports to the seizing air terminal once per 120 ms frame.

At the air terminal, an initial reference calibration is performed in function block 65 in FIG. 6B once per power on reset. Then, when an airline phone user requests a dial tone, the aircraft air terminal calculates a seizure frequency, as indicated in function block 66. Once the seizure frequency has been calculated, then, in function block 67, the air terminal performs a fine frequency calibration.

GS Primary Frequency Reference Calibration

The ultimate frequency reference in the system is the Primary Frequency Reference 18 (FIG. 3) in each ground station (CS). This free-running oscillator is specified to be within ±0.1 ppm for five years. After that time, each ground station would be recalibrated. Ground station recalibration consist of measuring the absolute frequency of the Primary Frequency Reference using a suitable instrument and entering the value into the control software, where it is saved in nonvolatile storage. The hardware platform on which the control and communications software runs has communications links to maintenance and network control computers which are not strictly part of the ground station, but which allow for maintenance and operation of the network of ground stations, one aspect of which is the ground station calibration operation just described. Once the absolute frequency of the Primary Frequency Reference is known, it can be used in all subsequent calculations. In any case, the software knows this value as $F_{primary}$ entered at calibration time.

GS Transmission Frequency Calibration

Each Transmission Frequency Reference in the ground station drives comparison logic blocks along with the Primary Frequency Reference. The comparison logic performs a frequency counting function on the Transmission Frequency Reference frequency using the Primary Frequency Reference frequency as a basis. The control software then reads the frequency of the Transmission Frequency Reference from the comparison logic and, using the known actual Primary Frequency Reference frequency $F_{primary}$, calculates the actual $F_{ref}$.

Rearranging equation (3), the formula for calculating $F_{corrected}$ for an ground station transmitter is:

$$F_{corrected} = (87.36\hat{F}_{ref} - F_{TXGSRF}) \times \frac{10^7}{\hat{F}_{ref}} \quad (7)$$

From this, all ground station transmission frequencies are exact.

One of the aspects of the invention is that neither the transmission frequency references nor the primary frequency references are ever actually adjusted to calibrate them. The correction of the transmission frequencies is done by measuring them and determining a corrected frequency to which to tune the frequency synthesizers. This corrected frequency, when translated by the (imperfect) transmission frequency reference, ends up being the "perfect" transmission frequency.

Initial AT Reference Oscillator Calibration

Because the air terminal reference oscillator may ultimately drift ±5 ppm over its lifetime, it must be coarsely calibrated before any seizure can be attempted. This calibration consists of scanning all ten cells for any pilot signal. The frequency of any pilot signal that is found is known to be within about ±1.2 ppm (because of the Doppler shift that may be present), so the air terminal reference can be immediately calibrated to within ±1.2 ppm by determining how much $\hat{F}_{ref}$ would have to change to make $F_{offset}$ go to zero.

$$\hat{F}_{ref} = \frac{F_{RXATRF(nom.\,pilot)} \times 10^7}{87.14 \times 10^7 - F_{corrected} - F_{offset}} \quad (8)$$

AT Seizure Frequency Calculation

The air terminal attempts to seize a channel as close to its center as practical by correcting the transmission for Doppler shift. The Doppler shift is estimated to be $-1.05294 \times F_{offset}$ of the pilot channel. The sign is negative to account for a frequency inversion on the receive side. Thus, the $F_{corrected}$ for a seizing air terminal is $$F_{corrected} = (F_{TXATRF(nom.\,seizure)}) + \quad (9)$$

$$1.05294 F_{offset} - 87.14 F_{ref}) \times \frac{10^7}{\hat{F}_{ref}}$$

Note that the very first seizure assumes that the Doppler shift is zero. $F_{offset}$ was used for initial calibration of the reference oscillator. Subsequent seizures will assume that $F_{offset}$ is due entirely to Doppler shift.

GS Seizure Detection Offset Calculation

When the ground station sees a seizure, it must measure the frequency offset, which could be a little more than twice the ground to air Doppler shift. The reason it could be so high is that if an air terminal happens to perform an initial calibration on a pilot with Doppler shift, the air terminal will misjudge its reference frequency error by an amount corresponding to the Doppler shift. When it seizes the first time, it will seize with no Doppler compensation because it assumed that the pilot had no Doppler shift. The error in $\hat{F}_{ref}$ due to the presence of ground to air Doppler shift is multiplied by about 1.0529. Then, the air to ground Doppler shift is added for a total of 2.0529×the ground to air Doppler shift.

The ground station measures the frequency offset in Hertz and sends this data to the air terminal in the response message to the seizure signal. The air terminal will adjust itself to correct the frequency offset error, so when it begins transmitting traffic data, the transmission will be centered in the channel. The ground station will then see approximately zero offset. Any offset will be sent back to the air terminal for frequency tracking.

AT Fine Frequency Calibration

When the air terminal receives the seizure response, it observes what the ground station saw as its seizure offset. If the air terminal had correctly estimated its $\hat{F}_{ref}$ and the pilot Doppler shift, the offset would be about zero. Non-zero values (outside the limits of measurement error) indicates that either the Doppler shift has changed since the pilot Doppler shift was estimated or the $\hat{F}_{ref}$ on the air terminal was wrong. The air terminal should assume on the initial seizure that $\hat{F}_{ref}$ was wrong and correct it. Thereafter, the air terminal should monitor the ground station seizure offset for trends that may indicate drifting in $\hat{F}_{ref}$ in the air.

Rewriting and rearranging the equations for $F_{offset}$ in the air and ground yields two simultaneous equations which can be solved for $\hat{F}_{ref}$ and $F_{Doppler}$:

$$\hat{F}_{ref} = \frac{F_{offset:\ GS} + 1.05294 F_{offset:\ AT} + 1.05294 F_{TXGSRF(nom.\ pilot)} + F_{RXGSRF(nom.\ seizure)}}{178.8931916 + \left(\dfrac{F_{corrected\ seizure}}{10^7}\right) - 1.05294 \times \left(\dfrac{F_{corrected\ pilot}}{10^7}\right)} \quad (10)$$

$$F_{Doppler} = 87.14 \hat{F}_{ref} - F_{TXGSRF(nom.\ pilot)} - F_{offset:\ AT} - F_{corrected\ pilot} \times \left(\dfrac{\hat{F}_{ref}}{10^7}\right)$$

AT Reference Tracking

After the first seizure of a new ground station, the air terminal should be exactly on frequency and the ground station should report no offset during the traffic portion of the call. If the ground station does report a consistent offset, the $\hat{F}_{ref}$ may be slightly off frequency due either to measurement errors or drift in the oscillator. For this reason, the ground station measurements should be averaged over a fairly long period (several minutes) and the processes above should be repeated.

Power Control

Power control in the air terminal is done by having the ground station monitor the air terminal received power and telling the air terminal to raise or lower its power as required through the link management field of the traffic channel. Because the receive chain in the ground station is subject to gain variations with temperature, aging, and the like, it must be periodically calibrated. A calibrated, fixed frequency, fixed level test reference tone from module 14 is inserted into the receive chain at or near the antenna port, as shown in FIG. 3. Its frequency will be in a guard band or, alternatively, in an unused pilot channel. The calibration procedure consists of commanding the demodulator to tune to the test tone frequency and to measure its level. This measurement is then used to calibrate other signal levels. The measurement takes no more than a few hundred milliseconds.

The calibration procedure should be performed at least once every six minutes if a modem is not in use carrying a call. This will ensure that temperature changes of 20° C. per hour can be tracked with reasonable accuracy. During the time that the modem is being calibrated, it is unavailable to monitor channels. Therefore, the last channel that it was monitoring has to be marked unavailable during the calibration.

Power control in the air terminal has three parts. First, determine how much power to transmit to initially seize the channel such that enough is transmitted to be detected successfully, but not so much that adjacent channels are interfered with. Second, the transmitted power of the transmission is refined following seizure so that the level is optimum at the ground station. And third, the power throughout the course of the transmission is adjusted so that the level remains optimum at the ground station.

The first part of the air terminal power control is achieved according to the process shown in FIG. 7A. In function block 71, the power of the received pilot signal transmitted by the ground station is measured by the air terminal. Then in function block 72, the distance to the ground station is estimated based on the measured power level (the lower the level, the greater the distance). The determination of the distance to the ground station is also useful in determining how much time is left in a ground station cell for purposes of handoff and setting calls up and to avoid calibration of the air terminal transmitter too close to a ground station. The air terminal then sets its transmitter power to a level high enough to compensate for the distance, plus about 5 dB to make sure the level is great enough at the ground station to detect, but subject to the maximum power capability of the air terminal, as indicated in function block 73. The air terminal transmits a much narrower bandwidth seizure signal so that even though the level is higher than optimum, the signal does not violate FCC-imposed specifications of adjacent channel energy, as indicated in function block 74.

It is known that the pilot power the air terminal measures is not exact due to uncertainties in the receiver chain gain.

If this uncertainty can be estimated, then it is possible to estimate the distance to the ground station from measuring the pilot (or traffic) power in the air. We have a method for calibrating out the uncertainties in the receive and transmit chains based on the seizure power. Now, what we need is to determine how much of that calibration factor is associated with the transmit chain and how much is associated with the receive chain.

We accomplish this by assuming a known maximum transmit power out of the air terminal antenna and that this corresponds to the calibrated output power. Then, for all distances for which power control is not at a maximum, the amount of backoff from maximum transmit power is equal to the amount of pilot power above $P_{pilot}$, the theoretical value of pilot power at the maximum power control distance. Therefore, for a given seizure, $$\text{Pilot Power Actual} = P_{pilot} - TX_{max} + TX_{seize}$$
$$= \text{Pilot Power Measured} + C_1$$

The constant $C_1$ is the desired calibration constant:

$$C_1 = P_{pilot} - TX_{max} + TX_{seize} - \text{Pilot Power Measured}$$

$TX_{max}$ is the value that the control software must tell the frequency and power control logic to achieve maximum power, and $TX_{seize}$ is the value that the control software uses to seize ($P_{TX(seizure)}$ in equation (1)).

The second part of the power control is implemented by the process shown in FIG. 7B. In function block 75, the ground station measures the level of the seizure signal. Then, in function block 76, the ground station transmits to the air terminal information acknowledging the seizure and reporting the level of the seizure signal. The air terminal corrects the transmitted level by an amount needed to make the level at the ground station correct in function block 77 and then switches the transmission bandwidth to the full normal bandwidth at the corrected level in function block 78.

The third part of the power control is implemented by means of ground station signaling (typically with a few bits per second) to the air terminal to raise or lower the transmitted power to keep the received level optimum. These signaling bits occupy but a few bits of overhead in the ground-to-air data stream.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. In a mobile communication system wherein at least one mobile terminal is moving relative to a fixed station and the mobile terminal communicates with the fixed station over one of a plurality of channels, a method of stabilizing frequency and power level of transmissions of said mobile terminal and said fixed station comprising the steps of:

monitoring by a fixed station for available channels in the plurality of channels and modifying a vacant channel broadcast message to provide information that one or more of the plurality of channels is available;

transmitting a vacant channel signal by the fixed station, wherein said vacant channel signal corresponds to the vacant channel message;

upon request by a user at said mobile terminal for a communication connection, scanning for said vacant channel signal by said mobile terminal and selecting a vacant channel;

estimating a distance of said mobile terminal to the fixed station and setting by the mobile terminal a transmitted power level of a channel seizing signal based on the estimated distance;

estimating a Doppler frequency shift of the selected channel due to the relative movement of the mobile terminal with respect to the fixed station and setting a transmitted frequency of the channel seizing signal based on the estimated Doppler frequency shift;

transmitting the channel seizing signal at a reduced transmission bandwidth, less than a full normal bandwidth to said fixed station by said mobile terminal at the transmitted power level and the transmitted frequency;

measuring a received power level and a received frequency of the channel seizing signal, as received by the fixed station, and transmitting by the fixed station to the mobile terminal information acknowledging a seizure of the selected channel and reporting the received power level and the received frequency of the channel seizing signal to the mobile terminal; and correcting at the mobile terminal the transmitted level and the transmitted frequency and then switching the transmission reduced bandwidth to the full normal bandwidth at the corrected transmitted level.

2. The method of stabilizing frequency and power of transmissions of said mobile terminal and said fixed station recited in claim 1 further comprising the steps of:

providing at said fixed station at least one transmission frequency reference; and periodically calibrating said transmission frequency reference.

3. The method of stabilizing frequency and power of transmissions of said mobile terminal and said fixed station recited in claim 2 wherein a plurality of transmission frequency references are provided, one for each of said channels.

4. The method of stabilizing frequency and power of transmissions of said mobile terminal and said fixed station recited in claim 2 further comprising providing at said fixed station a single primary frequency of a power level of said vacant channel signal from said fixed station calibrated.

5. The method of stabilizing frequency and power of transmissions of said mobile terminal and said fixed station recited in claim 1 wherein said step of estimating a distance is performed based on a measurement of a received level of a signal from said fixed station.

6. The method of stabilizing frequency and power of transmissions of said mobile terminal and said fixed station recited in claim 5 further comprising the steps of:

providing at said fixed station a single primary frequency reference;

providing at said fixed station at least one transmission frequency reference; and periodically calibrating said transmission frequency reference against said primary frequency reference.

7. The method of stabilizing frequency and power of transmissions of said mobile terminal and said fixed station recited in claim 6 wherein a plurality of transmission frequency references are provided, one for each of said channels.

8. A mobile communication system comprising:

a fixed station having a plurality of channels, means for monitoring said plurality of channels and modifying a vacant channel broadcast signal to provide information that at least one of said plurality of channels is available and means for transmitting said vacant channel broadcast signal identifying vacant channels; and at least one mobile terminal moving relative to said fixed station, said mobile terminal communicating with said fixed station over one of the plurality of channels, said mobile terminal including means for scanning for said vacant channel broadcast signal and selecting a vacant channel upon request by a user at said mobile terminal for a communication connection, means for estimating a distance of said mobile terminal to the fixed station and setting by the mobile terminal a transmitted power level of a channel seizing signal based on the estimated distance, means for estimating a Doppler frequency shift of the selected channel due to the relative movement of the mobile terminal with respect to the fixed station and setting a transmitted frequency of the channel seizing signal based on the estimated Doppler frequency shift, and means for transmitting the channel seizing signal at a reduced transmission bandwidth less than a full normal bandwidth to said fixed station by said mobile terminal at the transmitted power level and the transmitted frequency;

said fixed station further including means for receiving the channel seizing signal and means for measuring a received power level and a received frequency of the channel seizing signal at the fixed station and transmitting to the mobile terminal information acknowledging a seizure of the selected channel and reporting the received power level and the received frequency of the channel seizing signal to the mobile terminal, and said mobile terminal further including means for correcting the transmitted power level and the transmitted frequency and then switching the reduced transmission bandwidth to the full normal bandwidth at the corrected level.

9. The mobile communication system recited in claim 8 wherein said fixed station further includes:

at least one transmission frequency reference; and means for periodically calibrating said transmission frequency reference.

10. The mobile communication system recited in claim 9 comprising a plurality of transmission frequency references, one for each of said channels.

11. The mobile communication system recited in claim 9 further comprising a single primary frequency reference against which said transmission frequency reference is calibrated.

12. The mobile communication system recited in claim 8 wherein said means for estimating a distance at said mobile station includes means for measuring a power level of said vacant channel broadcast signal from said fixed station.

13. A mobile communication system comprising:

a fixed terminal having a plurality of communication channels which each channel occupies a given bandwidth in a communication spectrum, wherein said fixed terminal broadcasts a channel availability signal indicating that one or more of said plurality of communications channels is available; and a mobile terminal which is tuned to receive signals from said fixed terminal, wherein said mobile terminal, in response to receiving said channel availability signal, selects one of the available channels and seizes said selected channel by sending a channel seizing signal of a reduced bandwidth, which is less than said given bandwidth of the communication channel to be seized, only during the period until a communication link is established, to prevent spillover of said channel seizing signal into adjacent channels, so as to thereby establish the communication link between said mobile terminal and said fixed terminal.

14. The communication system of claim 13, wherein said mobile terminal, prior to sending the channel seizing signal, estimates the distance from said mobile terminal to said fixed terminal and adjusts a power level of the channel seizing signal on the basis of said estimated distance.

15. The communication system of claim 14, wherein said mobile terminal estimates the distance to said fixed terminal on the basis of a power level of a first signal received from said fixed terminal.

16. The communication system of claim 15, wherein said fixed terminal transmits a pilot signal that is received by said mobile terminal and wherein said first signal comprises said pilot signal.

17. The communication system of claim 15, wherein said first signal comprises said channel availability signal.

18. The communication system of claim 13, wherein said mobile terminal determines a frequency of said channel seizing signal on the basis of said given bandwidth of the channel to be seized and on the basis of an estimated Doppler frequency shift of said channel seizing signal.

19. The communication system of claim 18, wherein said estimated Doppler frequency shift is determined by estimating the relative movement of said mobile terminal with respect to said fixed terminal.

20. The communication system of claim 13, wherein said fixed terminal transmits a return signal specifically addressed to said mobile terminal when said mobile terminal has seized one of said plurality of communication channels.

21. The communication system of claim 20, wherein said mobile terminal transmits a first channel seizing signal corresponding to a first available channel for a pre-selected period of time and, upon failing to receive said return signal from said fixed terminal, indicating that said mobile terminal has seized said first channel, said mobile terminal transmits a second channel seizing signal corresponding to a second available channel to seize said second available channel.

22. The mobile communication system of claim 20, wherein said fixed terminal determines a frequency offset and a power offset of said channel seizing signal from said mobile terminal and provides to said mobile terminal, as part of said return signal, information indicative of said offsets.

23. The mobile communication system of claim 22, wherein said frequency offset is representative of a difference between the frequency of the signal from said mobile terminal received by said fixed terminal and a desired frequency and wherein said power offset is representative of a difference between the power level of the signal from said mobile terminal received by said fixed terminal and a desired level.

24. The mobile communication system of claim 23, wherein said mobile terminal, upon receiving said return signal, transmits a communication signal, having a frequency and a power level, wherein the communication signal occupies substantially all of said given bandwidth of said communication channel and thereby establishes said communication link between said mobile terminal and said fixed terminal.

25. The mobile communication system of claim 24, wherein said mobile terminal periodically adjusts the frequency and power level of said communication signal on the basis of a signal received from said fixed terminal.

26. A method of establishing and maintaining communication between a fixed terminal and a mobile terminal, which moves relative to said fixed terminal, over one or more channels which are assigned an individual bandwidth in a communication spectrum, comprising the steps of:

said fixed terminal broadcasting one or more signals, including a channel availability signal which indicates that one or more channels are available;

scanning for said channel availability signal by said mobile terminal;

estimating the distance from said mobile terminal to said fixed terminal based upon the strength of a signal from said fixed terminal as received by said mobile terminal; and said mobile terminal transmitting a channel seizing signal at a reduced transmission bandwidth which is less than the individual bandwidth assigned to one of said channels to be seized, only during the period until a communication link is established, to prevent spillover of said channel seizing signal into adjacent channels, so as to establish the communication link between said mobile terminal and said fixed terminal.

27. The method of claim 26, wherein said channel seizing signal is transmitted by said mobile terminal at a power level that is selected based on the estimated distance to the fixed terminal.

28. The method of claim 27, wherein the estimated distance to the fixed terminal is determined based upon a power level of a signal from said fixed terminal that is received by the mobile terminal.

29. The method of claim 26, further comprising the step of determining a frequency for said channel seizing signal based upon an individual bandwidth of an available channel and based upon an estimated Doppler frequency shift.

30. The method of claim 29, wherein said estimated Doppler frequency shift is determined by estimating the relative movement of said mobile terminal with respect to said fixed terminal.

31. The method of claim 26, further comprising the step of said fixed terminal transmitting a return signal specifically addressed to said mobile terminal when said mobile terminal has seized said channel.

32. The method of claim 31, wherein said return signal includes information indicative of an offset between a power level of a signal from said mobile terminal as received by said fixed terminal, and a desired power level.

33. The method of claim 32, wherein said return signal includes information indicative of an offset between a frequency of a signal from said mobile terminal, as received by said fixed terminal, and a desired frequency of said signal.

34. The method of claim 33, wherein said mobile terminal adjusts a power level and a frequency of one or more signals transmitted to said fixed terminal in response to said offset information contained in said return signal.

* * * * *

UNITED STATES PATENT AND TRADEMARK OFFICE
CERTIFICATE OF CORRECTION

PATENT NO. : 5,455,964
DATED : October 3, 1995
INVENTOR(S) : Roos et al.

It is certified that error appears in the above-indentified patent and that said Letters Patent is hereby corrected as shown below:

```
Column 7, Line 53, change "(CS)" to --(GS)--.

Column 12, Line 42, change "frequency of a power level of said vacant
      channel signal from said fixed station calibrated" to --frequency
      reference against which said transmission frequency references
      are calibrated.--

Column 12, Line 48, change "of a received level of a signal from said
      fixed section" to --of a power level of said vacant channel
      signal from said fixed station.--
```

Signed and Sealed this

Eighteenth Day of June, 1996

*Attest:*

BRUCE LEHMAN

*Attesting Officer*    Commissioner of Patents and Trademarks